United States Patent
Frougier et al.

(10) Patent No.: US 11,777,275 B2
(45) Date of Patent: Oct. 3, 2023

(54) AUGMENTED SEMICONDUCTOR LASERS WITH SPONTANEOUS EMISSIONS BLOCKAGE

(71) Applicant: International Business Machines Corporation, Armonk, NY (US)

(72) Inventors: Julien Frougier, Albany, NY (US); Kangguo Cheng, Schenectady, NY (US); Ruilong Xie, Niskayuna, NY (US); Chanro Park, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/484,180

(22) Filed: Sep. 24, 2021

(65) Prior Publication Data
US 2022/0013986 A1    Jan. 13, 2022

Related U.S. Application Data

(62) Division of application No. 16/819,250, filed on Mar. 16, 2020, now Pat. No. 11,177,632.

(51) Int. Cl.
*H01S 5/00* (2006.01)
*H01S 5/10* (2021.01)
(Continued)

(52) U.S. Cl.
CPC ........ *H01S 5/1078* (2013.01); *H01S 5/06236* (2013.01); *H01S 5/18341* (2013.01);
(Continued)

(58) Field of Classification Search
CPC ............... H01S 5/1078; H01S 5/06236; H01S 5/18341; H01S 5/18347; H01S 5/227; H01S 2301/02
See application file for complete search history.

(56) References Cited

U.S. PATENT DOCUMENTS

| | | |
|---|---|---|
| 5,644,589 A | 7/1997 | Anthon |
| 5,822,351 A | 10/1998 | Kang |

(Continued)

OTHER PUBLICATIONS

J. Frougier et al., "Phase-transition-FET Exhibiting Steep Switching Slope of 8mV/decade and 36% Enhanced ON Current", Symposium on VLSI Technology Digest of Technical Papers 2016.

(Continued)

*Primary Examiner* — Kinam Park
(74) *Attorney, Agent, or Firm* — Fleit Intellectual Property Law; Jon Gibbons

(57) ABSTRACT

A device and a method to produce an augmented-laser (ATLAS) comprising a bi-stable resistive system (BRS) integrated in series with a semiconductor laser. The laser exhibits reduction/inhibition of the Spontaneous Emission (SE) below lasing threshold by leveraging the abrupt resistance switch of the BRS. The laser system comprises a semiconductor laser and a BRS operating as a reversible switch. The BRS operates in a high resistive state in which a semiconductor laser is below a lasing threshold and emitting in a reduced spontaneous emission regime, and a low resistive state in which a semiconductor laser is above or equal to a lasing threshold and emitting in a stimulated emission regime. The BRS operating as a reversible switch is electrically connected in series across two independent chips or on a single wafer. The BRS is formed using insulator-to-metal transition (IMT) materials or is formed using threshold-switching selectors (TSS).

6 Claims, 19 Drawing Sheets

(51) Int. Cl.
*H01S 5/062* (2006.01)
*H01S 5/183* (2006.01)
*H01S 5/227* (2006.01)

(52) U.S. Cl.
CPC ........... *H01S 5/18347* (2013.01); *H01S 5/227* (2013.01); *H01S 2301/02* (2013.01)

(56) References Cited

U.S. PATENT DOCUMENTS

| | | | |
|---|---|---|---|
| 5,936,266 A * | 8/1999 | Holonyak, Jr. | ......... H01L 33/30 257/97 |
| 6,026,108 A | 2/2000 | Lim et al. | |
| 6,306,572 B1 | 10/2001 | Kim | |
| 7,535,937 B2 | 5/2009 | Luo et al. | |
| 7,684,458 B2 | 3/2010 | Sato et al. | |
| 8,227,328 B2 | 7/2012 | Jiang et al. | |
| 8,837,547 B2 | 9/2014 | Johnson et al. | |
| 8,896,035 B2 | 11/2014 | Murali et al. | |
| 9,684,077 B2 | 6/2017 | Mead et al. | |
| 9,825,095 B2 * | 11/2017 | Pillarisetty | ............. H10B 63/30 |
| 10,170,520 B1 * | 1/2019 | Frougier | ........... H01L 21/76895 |
| 10,256,316 B1 * | 4/2019 | Frougier | ............... H01L 29/435 |
| 10,418,484 B1 | 9/2019 | Xie et al. | |
| 10,964,749 B2 * | 3/2021 | Fu | ........................ H10N 70/021 |
| 2002/0067540 A1 | 6/2002 | Delprat et al. | |
| 2003/0048824 A1 | 3/2003 | Shinagawa et al. | |
| 2003/0162315 A1 | 8/2003 | Kapon et al. | |
| 2004/0033044 A1 | 2/2004 | Abraham | |
| 2019/0109177 A1 * | 4/2019 | Chanemougame | .......................... H01L 29/66666 |
| 2019/0157844 A1 | 5/2019 | Gerhard et al. | |

OTHER PUBLICATIONS

H D. Summers et al., "Spontaneous emission control in quantum well laser diodes", vol. 2, No. 4 / Optics Express, pp. 151-156 Feb. 16, 2018.

J. Frougier et al., "Control of light polarization using optically spin-injected vertical external cavity surface emitting lasers", Applied Physics Letters Dec. 16, 2013.

N. Shukla et al., "Ag/HfO2 based Threshold Switch with Extreme Non-Linearity for Unipolar Cross-Point Memory and Steep-slope Phase-FETs", 2016.

N. Shukla et al., "A steep-slope transistor based on abrupt electronic phase transition", Nature Communication Aug. 7, 2015.

S. Noda et al., "Spontaneous-emission control by photonic crystals and nanocavities", Nature Photonics, pp. 449-458 Aug. 2007.

List of IBM Patents or Patent Applications Treated as Related.

* cited by examiner

AUGMENTED SEMICONDUCTOR LASERS WITH SPONTANEOUS EMISSIONS BLOCKAGE

CROSS-REFERENCE TO RELATED APPLICATIONS

This application claims priority to and is a Divisional application of U.S. patent application Ser. No. 16/819,250, filed on Mar. 16, 2020, entitled "Augmented Semiconductor Lasers With Spontaneous Emissions Blockage," the teaching of which is hereby incorporated by reference in its entirety.

BACKGROUND OF THE INVENTION

The present invention relates generally to semiconductor lasers, and more particularly, to semiconductor lasers with spontaneous emissions blockage.

Semiconductor lasers such as conventional edge-emitting lasers, also known as laser-diodes or vertical-cavity surface-emitting lasers (VCSELs) are commercially used in a very wide range of applications: Displays and illumination, data storage, communication, data reading, data recording, defense, laser printing, medical and cosmetic applications, material processing such as surface treatment, optical pumping sources and more.

When increasing the electrical power, typical semiconductor lasers transition between two different states at a given threshold current ($I_{th}$):

spontaneous emission state, which occurs below a threshold, to produce incoherent emission, randomized polarization, randomized phase, randomized emission direction, broad beam width; and stimulated emission state, which occurs above a power threshold, to produce laser operation characterized by coherent emission with identical photon energy, narrow line width, identical photon direction, identical photon phase or temporal coherence and identical photon polarization or coherently polarized light.

SUMMARY OF THE INVENTION

In one embodiment, shown is a device and a method to produce an augmented-Laser (ATLAS) comprising a bi-stable resistive system (BRS) integrated in series with a semiconductor laser. ATLAS exhibits reduction/inhibition of the Spontaneous Emission (SE) below lasing threshold by leveraging the abrupt resistance switch of the BRS.

In one embodiment, a laser system comprises a semiconductor laser and a bi-stable resistive system (BRS) operates as a reversible switch. The BRS is electrically connected in series with the semiconductor laser. The BRS operates in a high resistive state in which a semiconductor laser is below a lasing threshold and emitting in a spontaneous emission regime, and a low resistive state in which a semiconductor laser is above or equal to a lasing threshold and emitting in a stimulated emission regime. The BRS operating as a reversible switch is electrically connected in series across two independent chips or on a single wafer. The BRS is formed using insulator-to-metal transition (IMT) materials or is formed using threshold-switching selectors (TSS).

In another embodiment, a vertical wave guide laser semiconductor device comprises a semiconductor substrate, and a layer structure formed thereon with a quantization axis of an active medium layer that is in parallel with a vertical axis of an optical cavity. The layer structure includes a first wave guide layer with a first doping type disposed over a semiconductor substrate, the active medium layer disposed over the first wave guide layer, and a second wave guide layer with a second doping type and an oxidation layer disposed over the active medium layer. A mesa type structure with a top surface and a side wall is formed from the first wave guide layer. The active medium layer and the second wave guide layer and an aperture formed in the second wave guide layer. A bi-stable resistive system (BRS) is formed: i) on the first wave guide layer around the mesa type structure or ii) on the top surface of the mesa type structure.

In one embodiment the layer structure is a vertical-cavity surface-emitting laser (VSCEL) and the BRS is formed using insulator-to-metal transition (IMT) materials or formed using threshold-switching selectors.

In another embodiment, a vertical wave guide laser semiconductor device comprises a semiconductor substrate, and a layer structure formed thereon with a quantization axis of an active medium layer that is in parallel with a vertical axis of an optical cavity. The layer structure including a first wave guide layer with a first doping type disposed over a semiconductor substrate, the active medium layer disposed over the first wave guide layer, and a second wave guide layer with a second doping type and an oxidation layer disposed over the active medium layer. A mesa type structure with a top surface and a side wall formed from the first wave guide layer, the active medium layer, and the second wave guide layer and an aperture formed in the second wave guide layer. A bi-stable resistive system (BRS) formed on a back side of the semiconductor substrate with a first contact layer formed over the bi-stable resistive system; and a second contact layer formed over the second wave guide layer and having an opening over the aperture, the second contact layer is electrically isolated from the first contact layer. The bi-stable resistive system is formed using insulator-to-metal transition (IMT) materials or threshold-switching selectors (TSS).

An edge-emitting laser semiconductor device comprises a semiconductor substrate, and a layer structure formed thereon. The layer structure including a first cladding layer with a first doping type disposed over a top side of a semiconductor substrate; a first wave guide layer disposed over the first cladding layer, an active medium layer with multiple quantum wells disposed over the first wave guide layer, a second wave guide layer disposed over the active medium layer, and a second cladding layer with a second doping type disposed over the second wave guide layer. A mesa type structure is formed with a top surface and a side wall from the second cladding layer. An oxide layer is formed on either side of the mesa type structure. A bi-stable resistive system (BRS) formed i) on the top surface of the mesa type structure with a first contact layer formed thereon and a second contact layer formed on a bottom side of the semiconductor substrate, or ii) on a back side of the semiconductor substrate with a first contact layer formed thereon and a second contact layer formed on the top surface of the mesa type structure. The bi-stable resistive system is formed using insulator-to-metal transition (IMT) materials or a threshold-switching selectors (TSS).

In another embodiment, a vertical wave guide laser semiconductor device comprises a semiconductor substrate, and a layer structure formed thereon with a quantization axis of an active medium layer that is parallel with a vertical axis of an optical cavity. The layer structure including a first wave guide layer with a first doping type disposed over a semiconductor substrate, the active medium layer disposed over the first wave guide layer, and a second wave guide layer with a second doping type and an oxidation layer disposed over the active medium layer, with at last one layer of a bi-stable resistive system (BRS) formed i) within the active medium layer or ii) within the second wave guide layer; and a mesa type structure with a top surface and a side wall formed from the first wave guide layer, the active medium layer and the second wave guide layer and an aperture formed in the second wave guide layer. The bi-stable resistive system is formed using insulator-to-metal transition (IMT) materials or a threshold-switching selectors (TSS). The vertical wave guide laser in one example, is a vertical-cavity surface-emitting laser (VSCEL) and the bi-stable resistive system is formed using insulator-to-metal transition (IMT) materials or threshold-switching selectors (TSS).

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Non-Limiting Review of Semiconductor Device Descriptions

Figure 1:
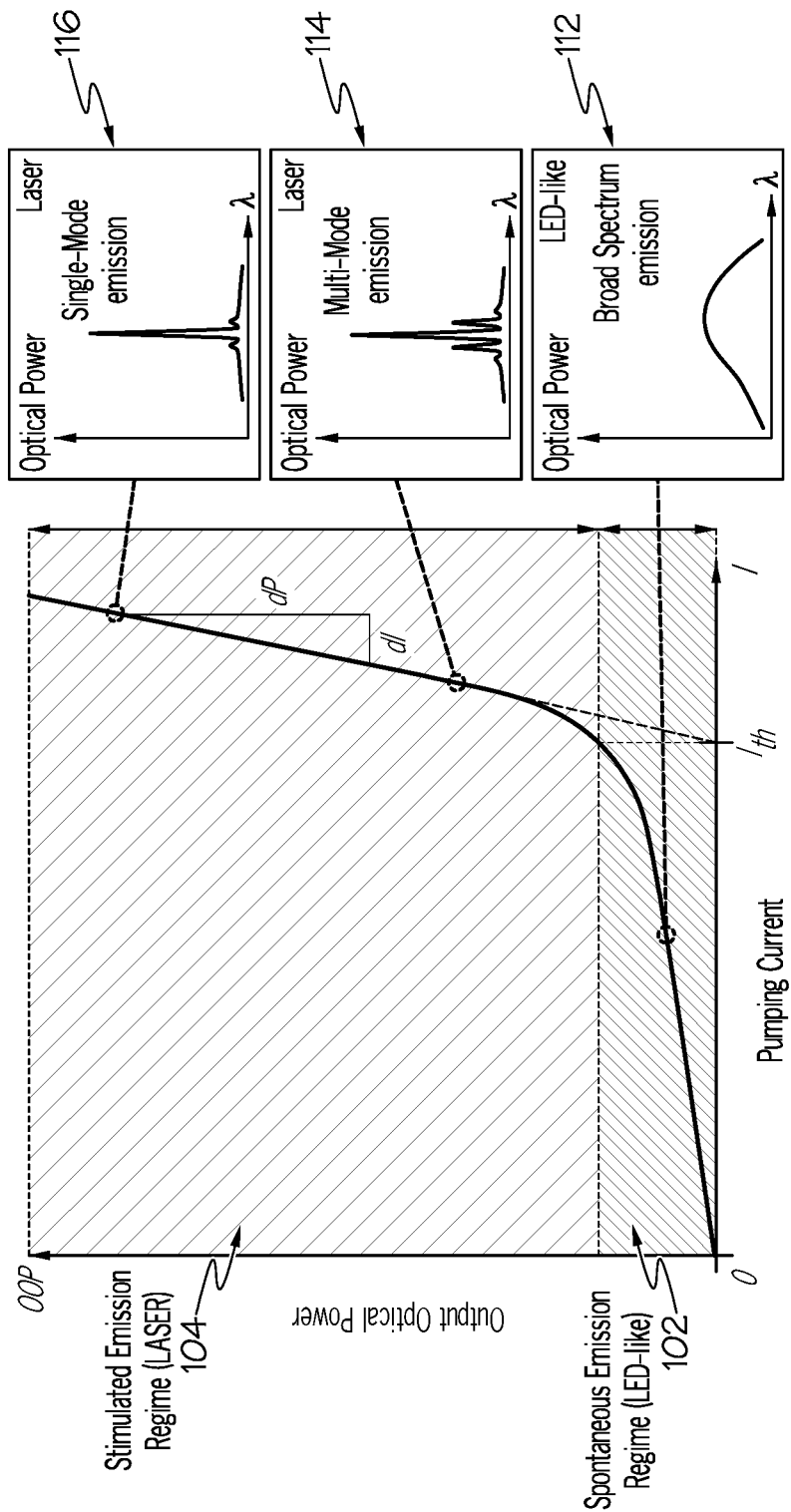
FIG. 1 illustrates a graph of the basic operating of a laser of FIG. 1 with respect to pumping current, according to the prior art.

It is to be understood that the various layers and/or regions shown in the accompanying drawings are not drawn to scale, and that one or more layers and/or regions of a type commonly used in laser semiconductor and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming the same in accordance with various embodiments of the present invention may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to substrate views herein. As used herein, "thickness" refers to a size of an element (e.g., a layer, trench, hole, etc.) in the cross-sectional views measured from a bottom surface to a top surface or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to the height of the element if the element is directly on the substrate. As used herein, "lateral", "lateral side", and "lateral surface", and the like refer to a side surface of an element (e.g., a layer, an opening, a fin, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

It will also be understood that when an element such as a layer, region or substrate is referred to as being "on" or "over" another element, it can be directly on the other element or intervening elements may also be present. A similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods, as described herein, may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations appearing in various places throughout the specification, are not necessarily all referring to the same embodiment.

It is to be understood that the various layers and/or regions shown in the accompanying drawings are not drawn to scale, and that one or more layers and/or regions of semiconductor lasers may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be by any process that grows, coats, or otherwise transfers a material onto the wafer. Available technologies include, for example, physical vapor deposition (PVD), chemical vapor deposition (CVD), electrochemical deposition (ECD), molecular beam epitaxy (MBE), and more recently, atomic layer deposition (ALD) among others.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane, and combinations thereof.

Removal may be by any process that removes material from the wafer; examples include etch processes (either wet or dry), reactive ion etching (RIE), and chemical-mechanical planarization (CMP).

Patterning refers to the shaping or altering of deposited materials, and can be generally referred to as lithography by applying a patterned mask. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist can be removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Overview of Reduction of Spontaneous Emission (SE)

As identified by others, including by S. Noda et al., SE control by photonic crystals and nanocavities, Nature Photonics 1, 449 (2007), spontaneous emissions in lasers is problematic for several reasons.

The first reason that spontaneous emission in lasers limits the performance of photonic devices in applications including illumination, displays, optical communication, solar energy and quantum-information systems.

The second reason that spontaneous emission in lasers, which are coherent light sources, is problematic is noise. Spontaneous emissions (SE) that do not couple to the lasing mode will raise the lasing threshold and become unwanted noise. As a result, there is a strong motivation to achieve control over SE and inhibit it when it is not desired or alternatively concentrate it into useful forms. In fact, controlling SE can be considered one of the most important objectives of current photonics research. Controlling SE may lead to important and dramatic advances in device performance.

Various embodiments will now be discussed in further detail with regard to semiconductor devices and methods of manufacturing the same and, in particular, to a fabrication method and structure for the reduction or inhibition of the spontaneous emission in semiconductor lasers below the lasing threshold using a bi-stable resistive system (BRS).

The presently claimed invention harnesses the unique property of any system exhibiting a unipolar abrupt reversible and electrically triggered resistance switch between two stable resistance states.

BRS used in the present invention include:
i) insulator-to-metal transition (IMT) materials, such as, relaxed, strained, 3D-bulk, thin film, 2D-nanosheet, 1D-nanowire based on: $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, and any oxides of the form $ABO_3$ Perovskite;
ii) threshold-switching selectors (TSS) are based on the combination of a thin insulator layer with a metal such as: $Ag/HfO_2$, $Cu/HfO_2$, $Ag/TiO_2$, $CuxS$, $Ag/a$-$Si$, $AgTe/TiN/TiO_2/TiN$; and
iii) any other materials or combination of materials used in magnetic or resistive memories such as Spin-Transfer-Torque structures (STT-MRAM), Phase-Change Memories (PCM), Resistive Memories (ReRAM), and equivalents.

The BRS is integrated in series with the semiconductor laser, such as an edge-emitting laser or laser-diode and a vertical-cavity surface-emitting laser (VCSEL). The BRS helps reduce/inhibit the SE below lasing threshold.

As described below, the BRS can be integrated in various embodiments including:
i) electrically: through an electrical connection between a first circuit integrating the BRS and a second circuit integrating the semiconductor laser. This integration may be between electrical connection of two independent chips with external wiring or may be an electrical connection of two chips integrated on the same wafer with integrated interconnect;
ii) monolithically: on the semiconductor laser, ex:, inside a contact via, as part of the Distributed Bragg Reflector (DBR) or wave guide adjacent to the active medium, etc.;
iii) monolithically intra-cavity: in a node of the stationary electromagnetic field to minimize light absorption (e.g., in VCSELs).

Basic Laser Operation Review

FIG. 1 illustrates a graph of the basic operating of a laser with respect to pumping current, according to the prior art. Typical output optical power vs. pumping current (I) characteristics and the corresponding output spectrum of a laser diode. The threshold current $I_{th}$ can be defined as the pumping current level at which a laser's output is dominated by stimulated emission rather than by spontaneous emission. On a typical P-I characteristic, the threshold current $I_{th}$ corresponds to the intersection of the extension of the coherent radiation output characteristic with the I-axis.

A LASER (Light Amplification by Stimulated Emission of Radiation) system is composed of an active medium placed inside an optical resonator (optical cavity). Energy is supplied to the laser medium by the pumping system. This energy is stored in the form of electrons trapped in the metastable energy levels. Pumping must produce a population inversion i.e., more atoms in the metastable state than the ground state, before laser operation can take place.

When population inversion is achieved, the spontaneous decay of a few electrons from the metastable energy level to a lower energy level starts a chain reaction. This corresponds to the spontaneous emission portion 102 of the graph in FIG. 1 corresponding graph of optical power versus wavelength 112 as shown.

Increasing the current moves the laser into the simulated multimode emission section 104 and corresponding graph of optical power versus wavelength 114 as shown. The photons emitted spontaneously will hit (without being absorbed) other atoms and stimulate their electrons to make the transition from the metastable energy level to lower energy levels.

Increasing the current even further in the simulated multimode emission section 104 results in a full single mode emission of FIG. 1. Photons are emitted of precisely the same wavelength, phase, and direction. The corresponding graph of optical power versus wavelength 116 is shown.

This action occurs in the optical cavity. When the photons that decay in the direction of the mirrors (most are lost) reach the end of the laser material, they are reflected back into the material, where the chain reaction continues and the number of photons increases. When the photons arrive at the partially-reflecting mirror, only a portion will be reflected back into the cavity, and the rest will emerge as a laser beam.

Figure 2:
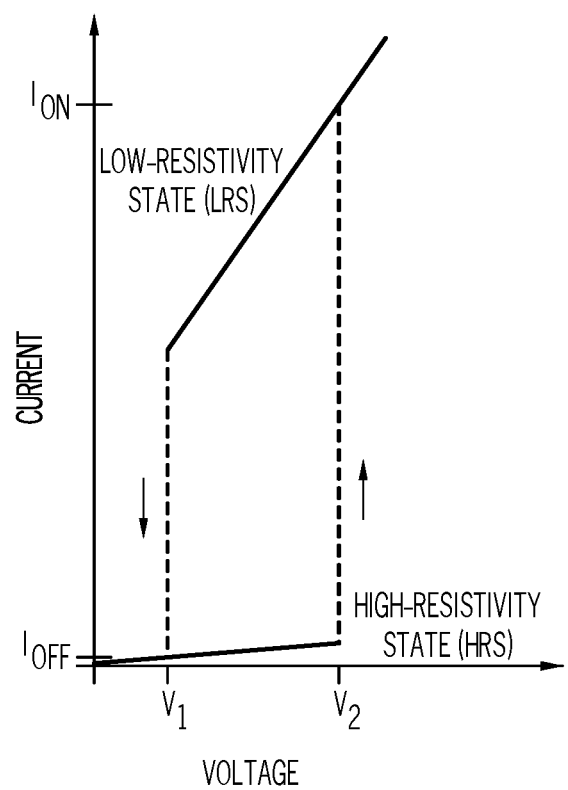
FIG. 2 illustrates a graph of current versus voltage characteristic of a bi-stable resistive system, according to the prior art.

FIG. 2 illustrates a graph of current versus voltage of a bi-stable resistive system (BRS), according to the prior art. As shown, the BRS exhibits a unipolar abrupt reversible and electrically triggered resistance switch or simply referred to as a reversible switch. The construction of BRS systems is described above and includes IMT materials, TSS, and other systems used in magnetic or resistive memories.

The horizontal axis represents voltage $V_1$ and $V_2$ at the switching voltage thresholds. The vertical axis represents the current where $I_{OFF}$ and $I_{ON}$ are the current levels. The high-resistivity insulating state (HRS) at $V_1$ reduces the pumping current flowing through the system ($I_{OFF}$), while the abrupt resistance switching to the low-resistivity metallic state (LRS) at $V_2$ results in a negligible reduction of the on-state pumping current ($I_{ON}$).

Figure 3:
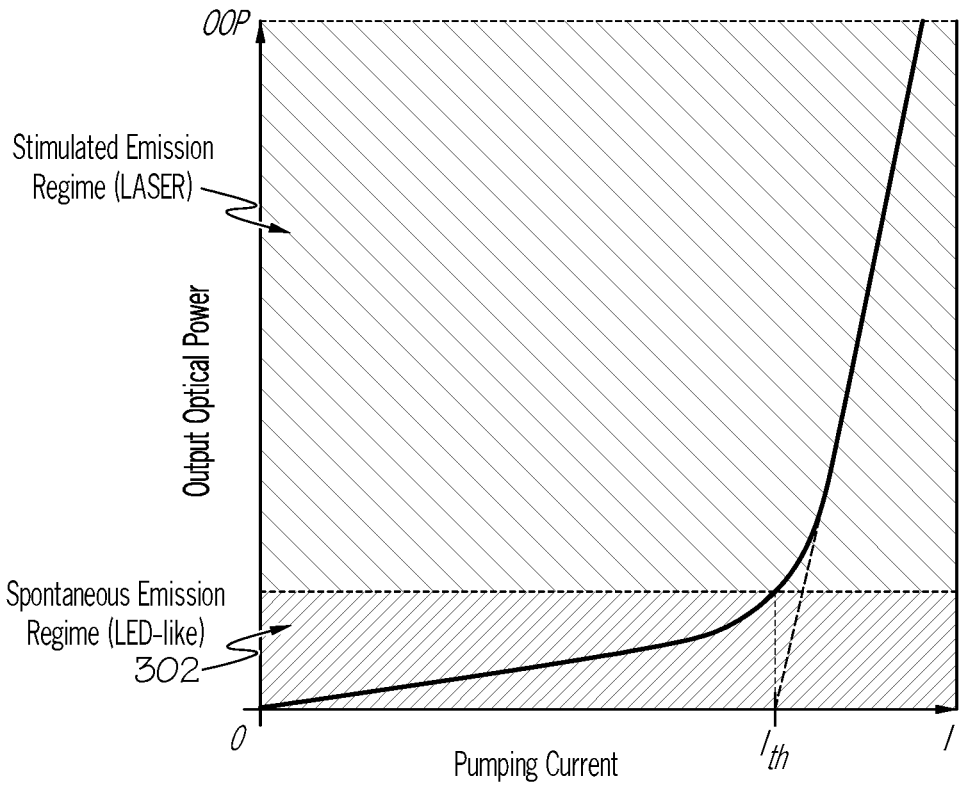
FIG. 3 is a graph of output optical power versus the pumping current of a classical laser, according to the prior art.
Figure 4:
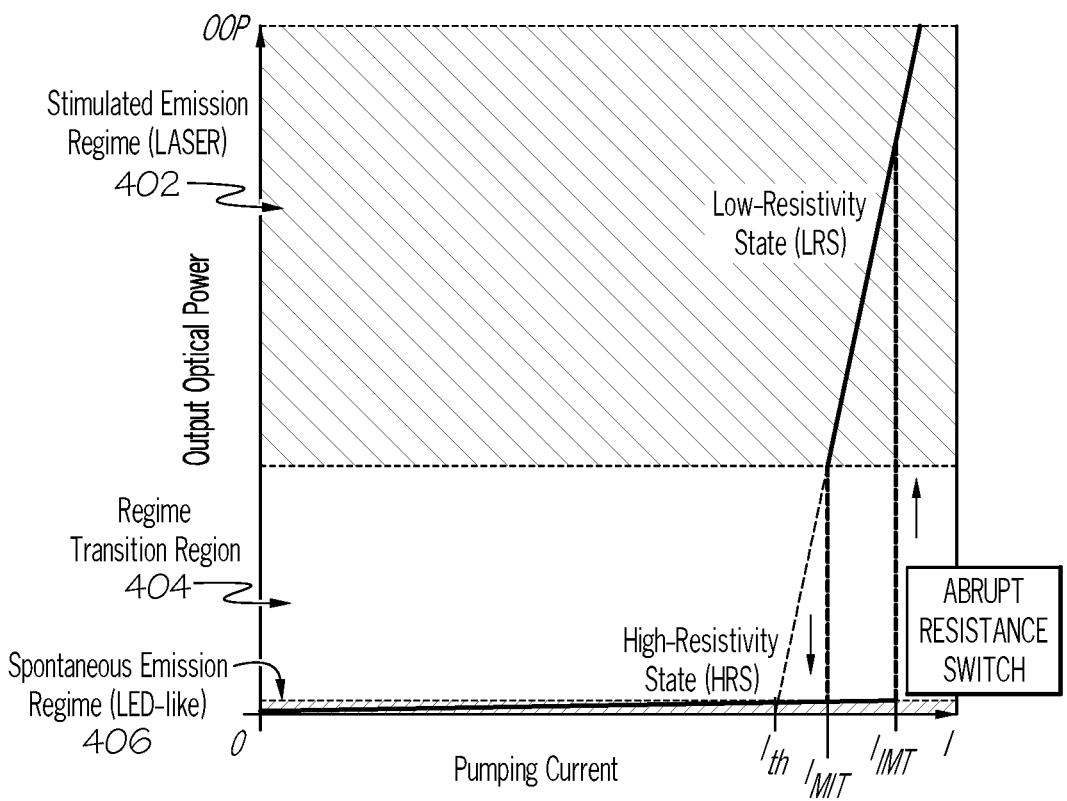
FIG. 4 is a graph of output optical power versus the pumping current of an augmented laser using a bi-stable system, according to one embodiment of the present invention.

FIG. 3 is a graph of output optical power versus pumping current of a classical laser, according to the prior art which corresponds to the FIG. 1 described above. Shown, adjacent to FIG. 3, is FIG. 4 which is a graph of output optical power versus pumping current of an augmented-laser using a BRS, according to one embodiment of the claimed invention. Notice in FIG. 4 that the slope of the curve is almost flat in the spontaneous emission region 402 up to the BRS threshold current ($I_{IMT}$) as compared with the slope of the curve in the spontaneous emission region 302 of FIG. 3. This corresponds to the OFF-state of the augmented-Laser where the BRS in the insulating High Resistance State (i.e. HRS). In the OFF-state the effective voltage across the laser is reduced by the potential drop across BRS due to the large insulator resistance. This reduces the effective pumping current reaching the active medium of the LASER, thus reducing the effective Spontaneous Emission below lasing threshold ($I_{th}$). This mechanism leads to a much smaller spontaneous emission region 402 as compared with the classic laser in FIG. 3. As shown the present invention significantly decreases or eliminates the spontaneous emission region 402. An optimal or suitable design augmented-laser design requires to have the Insulator-to-Metal Transition threshold current ($I_{IMT}$) of the BRS greater than the lasing threshold current of the Laser ($I_{th}$). Once the pumping current reaches the $I_{IMT}$ value, the BRS abruptly switches to a Low Resistance State (i.e. LRS) abruptly increasing the effective pumping current reaching the active medium above the lasing threshold ($I_{th}$). The augmented-Laser abruptly switches from a residual spontaneous emission regime (402) to a stimulated emission regime (406). The Regime Transition Region (404) with no Output Optical Power (OOP) originates from the abrupt resistance switch of the BRS and is a region where the laser does not effectively operate. Similarly, when the pumping current is reduced back to the $I_{MIT}$ value, the BRS abruptly switches back to a High Resistance State (i.e., HRS) abruptly decreasing the effective pumping current reaching the active medium below the lasing threshold ($I_{th}$). The augmented-Laser abruptly switches back from the stimulated emission regime (406) to the residual spontaneous emission regime (402) while transitioning through the Regime Transition Region (404). The operating principal is further explained with reference to FIG. 5A and FIG. 5B.

Figures 5A, 5B:
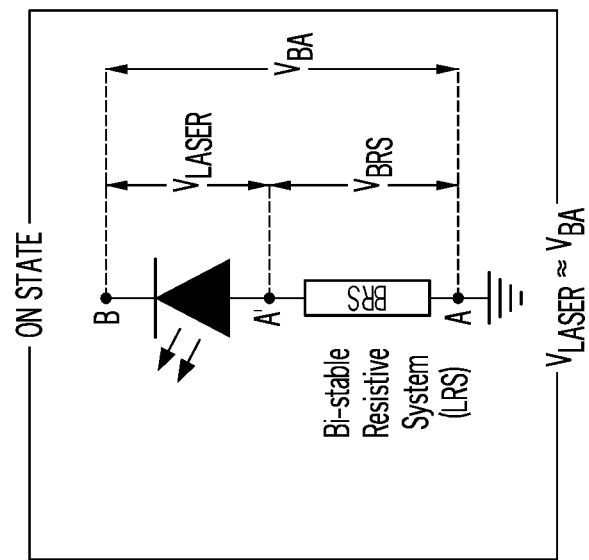
FIG. 5A and FIG. 5B is an illustration of an augmented laser switching reversibly between an OFF-state and an ON-state associated with a high resistive state (HRS) and a low resistive state (LRS) of the bi-stable resistive system, respectively, according to one embodiment of the present invention.

FIG. 5A and FIG. 5B is a schematic illustration of an augmented laser device composed of a BRS electrically integrated in series with a laser-diode, switching reversibly between OFF-state and ON-state. In the OFF state in FIG. 5A, when the BRS is in the insulating High Resistance State (HRS), the effective voltage across the Laser ($V_{LASER}$) is reduced by the potential drop across the BRS due to the large insulator resistance such that $V_{LASER}=V_{BA}-V_{BRS}$. Potential drop across BRS due to the large insulator resistance. This reduces the effective pumping current reaching the active medium of the LASER, thus significantly decreasing or eliminating the spontaneous emission below lasing threshold ($I_{th}$).

Referring to FIG. 5B, the ON state is when the BRS is in the metallic Low Resistance State (LRS), and the effective gate voltage of the LASER is $V_{LASER} \approx V_{BA}$ since the potential drop across the BRS becomes negligible as the metallic state has multiple orders of magnitude lower resistance. As a result, the ON-state pumping current loss is negligible. The reversible resistance switch from HRS to LRS can be electrically triggered for both positive and negative voltage polarities.

Various Configurations of Laser Currents with BRS

Figure 6:
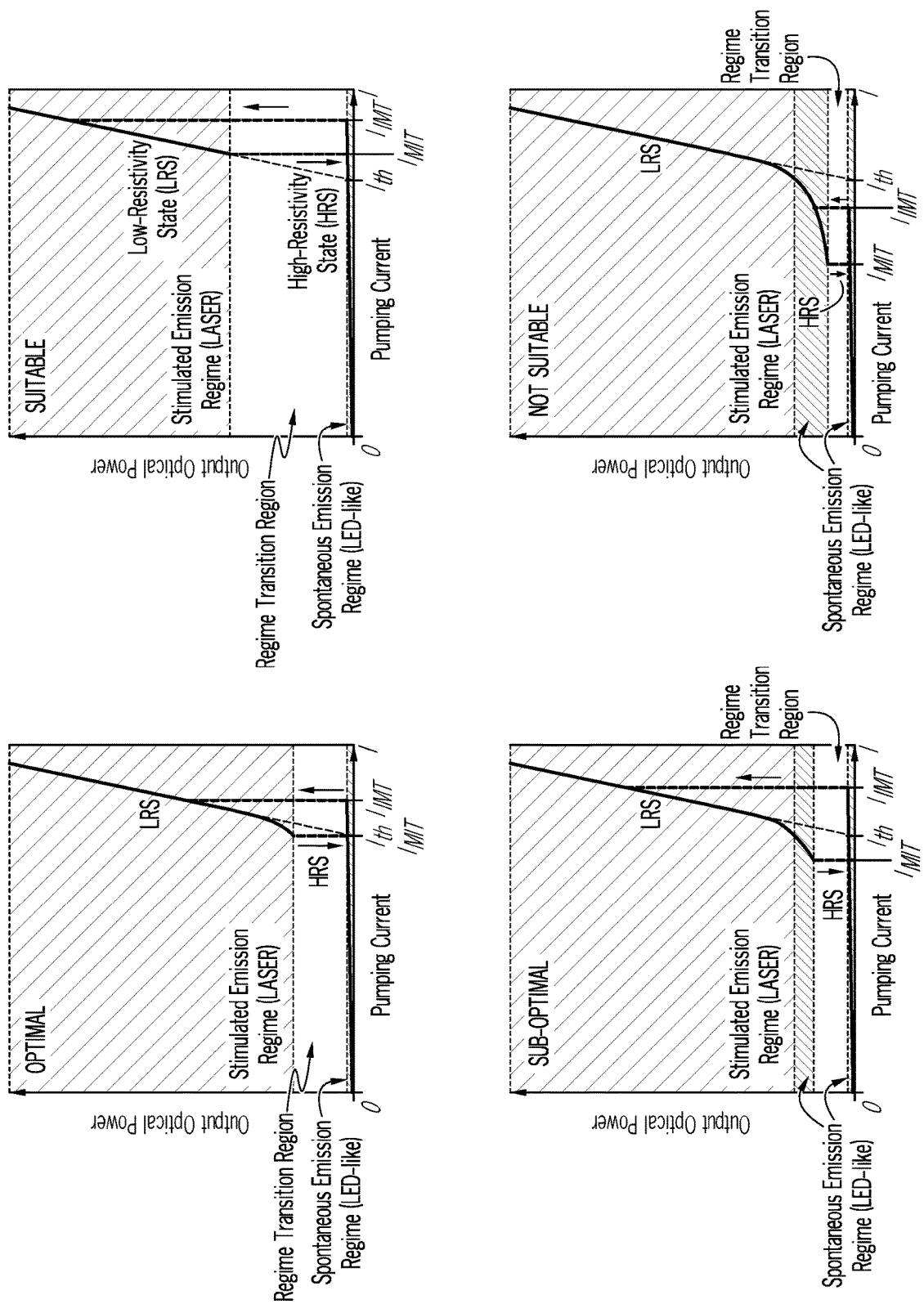
FIG. 6 is a series of graphs of output optical power versus pumping current for various configurations of an augmented laser with bi-stable resistive system, according to one embodiment of the present invention.

FIG. 6 is a series of graphs of output optical power versus pumping current for various configurations of an augmented laser with bi-stable resistive system, according to one embodiment of the present invention. More specifically, FIG. 6 illustrates four configurations of: i) Optimal Configuration; ii) Suitable Configuration; iii) Sub-Optimal Configuration; and iv) Not-Suitable Configuration, as follows:

i) Optimal Configuration in which;
    switching currents of the BRS are optimized relative to the threshold voltage of the laser;
    spontaneous emission region is inhibited for all pumping currents;

regime transition region is minimized;
stimulated emission region is maximized and accessible close to a lasing threshold; and
In this case $I_{MIT}=I_{th}<I_{IMT}$, where $I_{th}$ is the laser threshold current for lasing, $I_{IMT}$ is insulator-to-metal current and $I_{MIT}$ is metal to insulator current.

ii) Suitable Configuration in which:
spontaneous emission region is inhibited for all pumping currents;
regime transition region is larger;
stimulated emission region is not accessible very close to a lasing threshold;
need more energy to switch BRS compared to the optimal case; and
In this case $I_{th}<I_{MIT}<I_{IMT}$.

iii) Sub-Optimal Configuration in which:
spontaneous emission region accessible is reduced compared to conventional lasers;
stimulated emission region regime is not fully inhibited when turning off the laser: portion is accessible for pumping currents close and below lasing threshold; and
partially leveraging benefits of the BRS integration; and
In this case $I_{IMT}<I_{th}<I_{IMT}$.

iv) Not-Suitable Configuration in which
spontaneous emission region accessible is not significantly reduced compared to conventional laser;
Does not leverage the benefits of the BRS integration; and
In this case $I_{IMT}<I_{IMT}<I_{th}$.

Figure 7:
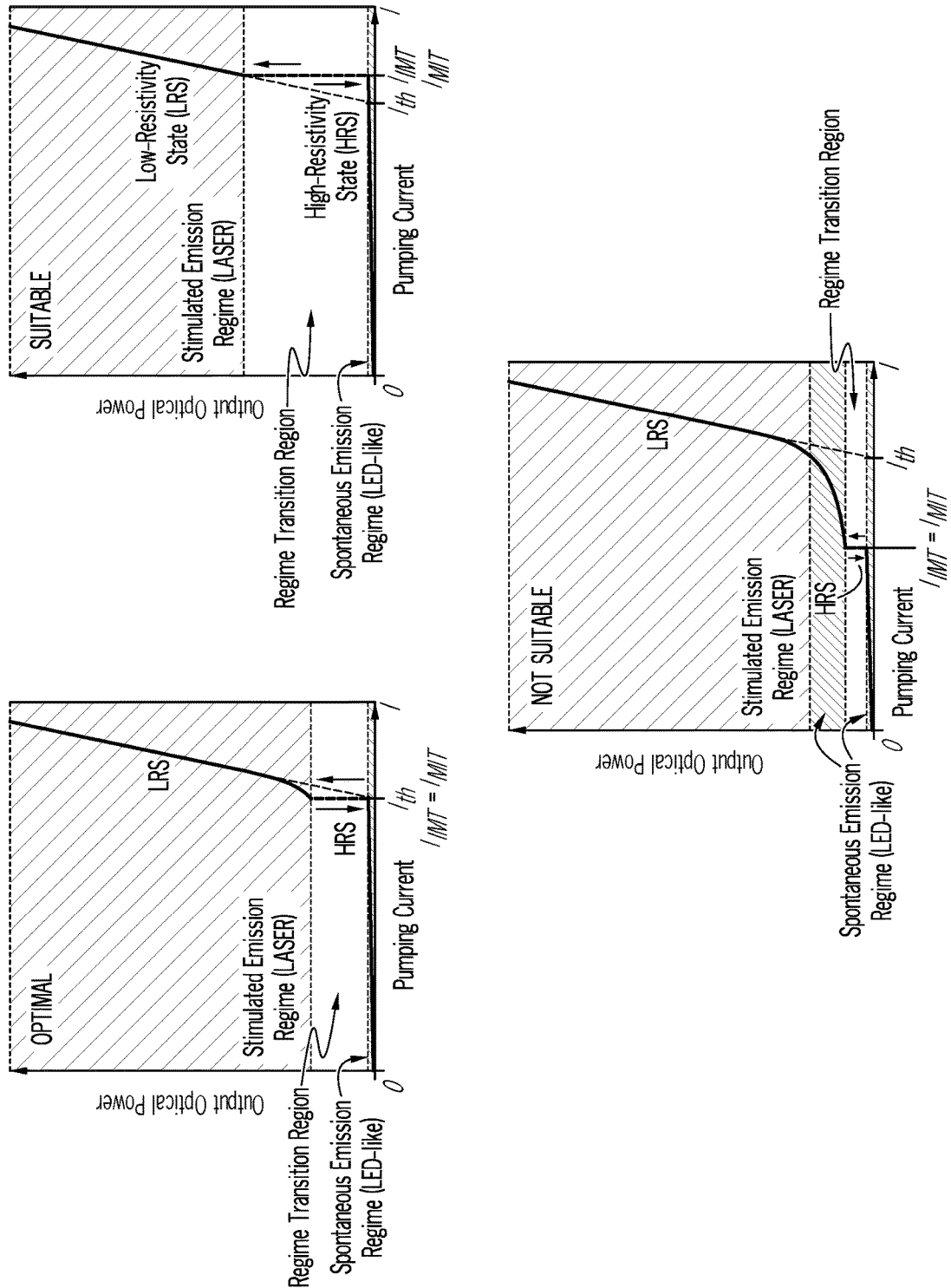
FIG. 7 is a series of graphs of output optical power versus pumping current for various configurations of an augmented laser with bi-stable resistive system exhibiting small or non-existent hysteresis as compared to the hysteresis in FIG. 6, according to one embodiment of the present invention.

FIG. 7 is a series of graphs of output optical power versus pumping current for various configurations of an augmented laser with bi-stable resistive system with small or non-existent hysteresis as compared to the hysteresis in FIG. 6, according to one embodiment of the present invention. More specifically, FIG. 7 illustrates three configurations of: i) Optimal Configuration; ii) Suitable Configuration; and iii) Not-Suitable Configuration, as follows:

i) Optimal Configuration in which:
switching currents of the BRS are optimized relative to the threshold voltage of the laser;
spontaneous emission region is inhibited for all pumping currents;
regime transition region is minimized;
stimulated emission region is maximized and accessible close to a lasing threshold; and
$I_{IMT} \approx I_{IMT} = I_{th}$ ii) Optimal Configuration in which:
spontaneous emission region is inhibited for all pumping currents;
regime transition region is larger;
stimulated emission region is not accessible very close to a lasing threshold;
Need more energy to switch BRS; and
In this case $I_{th}<I_{IMT}-I_{IMT}$.

iii) Not-Suitable Configuration in which:
spontaneous emission region accessible is not significantly reduced compared to conventional lasers;
does not leverage the benefits of the BRS integration; and
In this case $I_{IMT} \approx I_{IMT}<I_{th}$.

Figure 8:
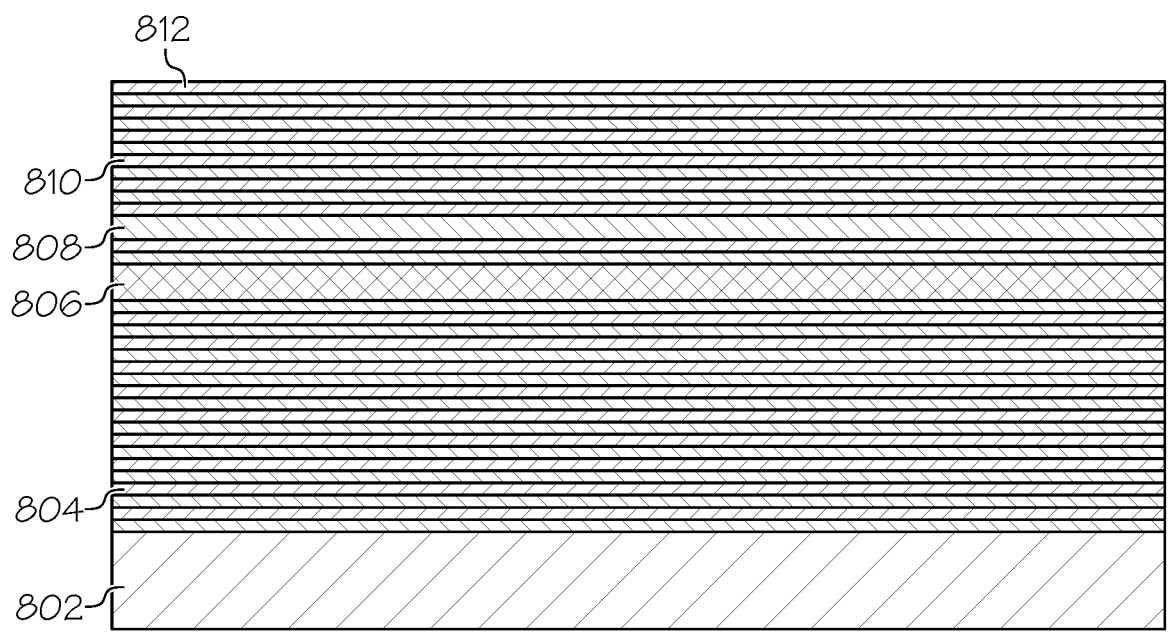
FIG. 8 is a side view illustrating an initial stage in the formation of a vertical cavity surface emitting laser semiconductor device with an integrated bi-stable resistive system, according to one embodiment of the present invention.

Embodiment 1: Vertical Wave Guide Semiconductor Device with BRS with Buried Bottom Contact FIG. 8 is a side view illustrating an initial stage in the formation of a vertical cavity surface emitting laser (VCSEL) semiconductor device using a bi-stable resistive system (BRS) with a buried bottom contact, according to one embodiment of the present invention. In this example, a GaAs based VCSEL with an emission at approximately λ~980 nm is given, however other architectures operating at different wavelengths are possible.

Referring to FIG. 8, a VCSEL device is shown, which includes an n-type GaAs (n-GaAs) substrate 802, and a layer structure formed thereon by an epitaxial growth process, such as molecular beam epitaxy (MBE) and/or metal organic chemical vapor deposition (MOCVD). The layer structure includes consecutively, as viewed from the GaAs substrate 802, an n-type lower Distributed Bragg Reflector (DBR) layer or wave guide layer 804, an active layer or active medium layer 806 that may include multiple quantum wells, and a p-type upper DBR layer 810. The p-type upper DBR 810 includes an oxidation layer 808. For simplicity, other optional layers, such as, cladding layers between the active medium 806 and DBR layers 804 and 808 are not shown. The active medium 806 emits light by recombination of positive holes and electrons injected from the p-side electrode (shown) and the n-side electrode (not shown), respectively.

The n-type DBR layer 804 as well as the p-type DBR layer 810 includes a plurality of layer pairs, each including an $Al_{x11}Ga_{1-x11}$ as a high-reflectivity layer and an $Al_{x12}Ga_{1-x12}$ as low-reflectivity layer where for example, $0 \leq x11 < 1$, $0 < x12 \leq 1$, $x11 < x12$, $x11 < x13 < x12$. The pair of DBR layers 804 and 810 allows the laser generated in the active layer 806 (3-10×(InGaAs/GaAsP)) to lase between the DBR layers 804 and 810 and pass through the upper DBR layer 810 as a laser beam having a desired output power. The upper DBR layer 810 has a top surface 812, as shown. The n-type DBR layer 804 may include dopants for GaAs: Substituting As: Te, S and substituting Ga: Sn, Si, Ge, where m×(n-GaAs/n-AlAs). The p-type DBR layer 810 may include dopants p-type dopants for GaAs: substituting As: Si, Ge and substituting Ga: Zn, Cn and n×(p-GaAs/p-AlAs). Typically, m>n so that the bottom DBR layer 804 reflectivity close to 100% while top DBR layer 810 has reflectivity less than 100%.

Figure 9A:
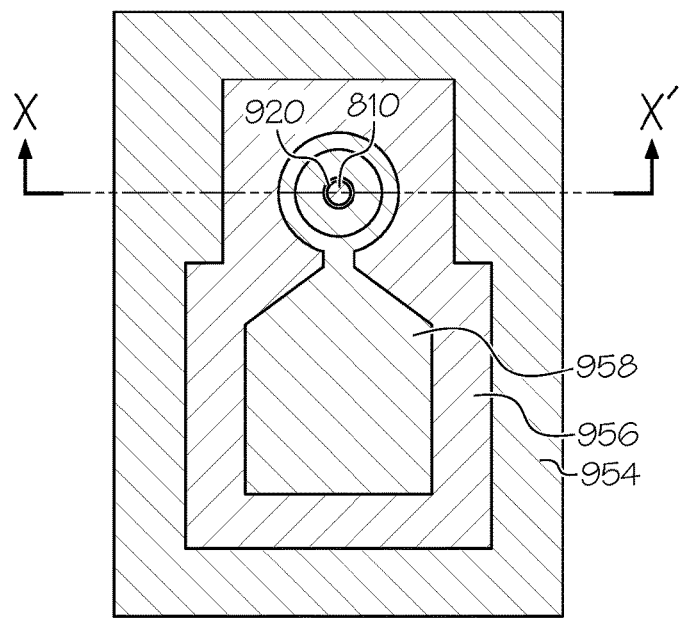
FIG. 9A is a top perspective view.
Figure 9B:
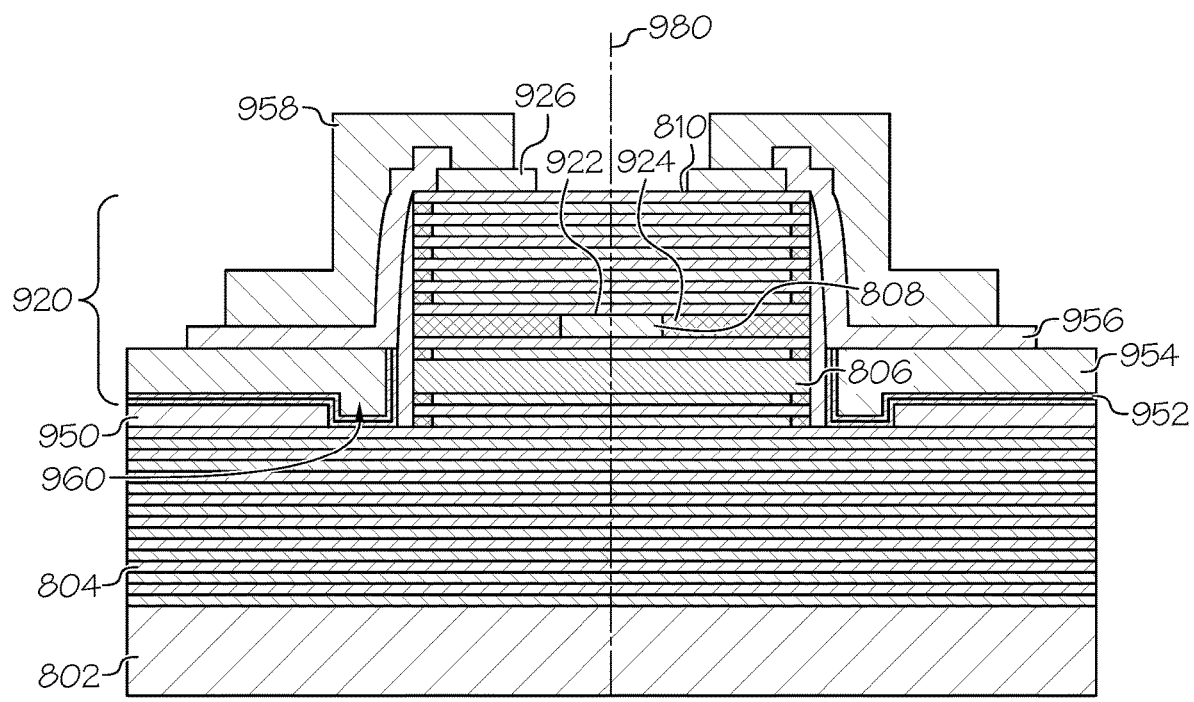
FIG. 9B is a corresponding cross-sectional view taken along line X-X' illustrating a later stage in forming the vertical cavity surface emitting laser semiconductor device of FIG. 8 with a bi-stable resistive system integrated on buried bottom contact, according to one embodiment of the present invention.

FIG. 9A is a top perspective view and FIG. 9B is a corresponding cross-sectional view taken along line X-X' illustrating a later stage in forming the vertical cavity surface emitting laser semiconductor device of FIG. 8 with a bi-stable resistive system integrated on buried bottom contact, according to one embodiment of the present invention.

In FIG. 9B, a combination of lithography, anisotropic etch, and organic planarization layers (OPL) not shown, is used to selectively etch the p-type DBR layer 810, the active medium layer 806, the oxidation layer 808, and the n-type DBR 804 to form a mesa type structure 920 as shown.

A selective oxidation process is used to form an aperture 922 by the formation of oxide 924 in the oxidation layer 808 as shown. A dielectric layer 950, such as silicon boron carbon nitride (SiBCN), is conformally deposited over the top surface and sides of the mesa type structure 920 and over the n-type DBR 804. An OPL (not shown), lithography patterning and anisotropic etch is used to form bottom contact layer wells 960.

The OPL (not shown) is removed using an ash process. A conformal multi-layer BRS 952 is deposited, followed by lithography and dielectric etch back to form the structure as shown over the dielectric layer 952 and contact layer wells 960. In this example, the BRS is a threshold switching selector (TSS), such as ex: $Ag/HfO_2$, $Cu/HfO_2$, $Ag/TiO_2$. It is important to note that although the integration of a multi-layer TSS is described, an insulator-to-metal transition (IMT) material or other bi-stable resistive system could be implemented instead.

A bottom contact layer 954, such as Ti/Au, is formed on top of vertical and horizontal portions of the BRS layer 952, including within the contact layer wells 960 using metal deposition techniques. Next, a selective recess of the bottom metal contact layer is performed, follow by TSS chamfering using the bottom metal contact layer formed.

An upper metal contact layer 926 is formed over the top horizontal portion of the p-type top DBR layer 810 using using sequential metal deposition, lithography patterning and metal etch techniques. Using conformal dielectric deposition, a SiN layer is formed 956 on the side walls of the mesa-type structure 920 and over the bottom contact layer 954. A portion of the bottom contact layer furthest from the mesa-type structure 920 is exposed after the dielectric layer 950 is formed, as shown. Lithography patterning using OPL (not shown) and selective dielectric etch back as shown, are used to form the structure.

A top contact layer 958 is formed over upper contact layer 926 using sequential metal deposition, lithography patterning, and metal etch techniques. A portion of the bottom contact layer 954 and dielectric layer 950 furthest from the mesa-type structure 920 is exposed after the dielectric layer 950 is formed, as shown. The top contact layer 958 is electrically isolated from the bottom contact layer 954. A quantization axis 980 is shown parallel to an optical cavity defined by mesa-type structure 920.

Figure 10:
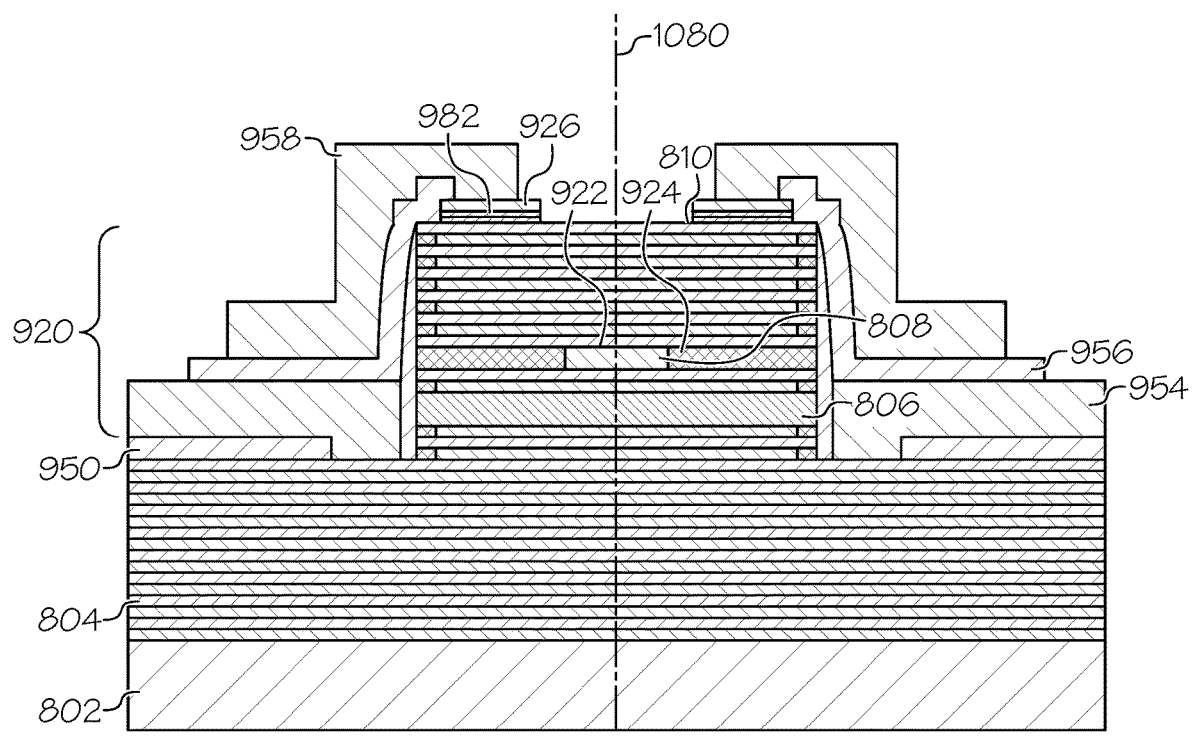
FIG. 10 is a cross-sectional view taken along line X-X' illustrating a later stage in forming the vertical cavity surface emitting laser semiconductor device of FIG. 8 with a bi-stable resistive system integrated on a top contact, according to one embodiment of the present invention.

Embodiment 2: Vertical Wave Guide
Semiconductor Device with BRS with Top Contact FIG. 10 is a side view of illustrating a vertical cavity surface emitting laser semiconductor device using a bi-stable resistive system integrated on a top contact, according to another embodiment of the present invention. The process flow for FIG. 8 through FIG. 9A is modified so that the BRS layer 952 is no longer formed.

In this embodiment prior to the formation of the top contact layer 958 and the upper contact layer 926, a BRS layer 982 is formed using sequential metal deposition, lithography patterning, and etch techniques to form the structure as shown. The BRS layer 982 is formed over the top horizontal portion of the p-type top DBR layer 810. In this example, the BRS is a threshold switching selector (TSS), such as ex: Ag/HfO$_2$, Cu/HfO$_2$, Ag/TiO$_2$. It is important to note that although the integration of a multi-layer TSS is described, an insulator-to-metal transition (IMT) material or other bi-stable resistive systems could be implemented instead. A quantization axis 1080 is shown parallel to an optical cavity defined by mesa-type structure 920.

Figure 11:
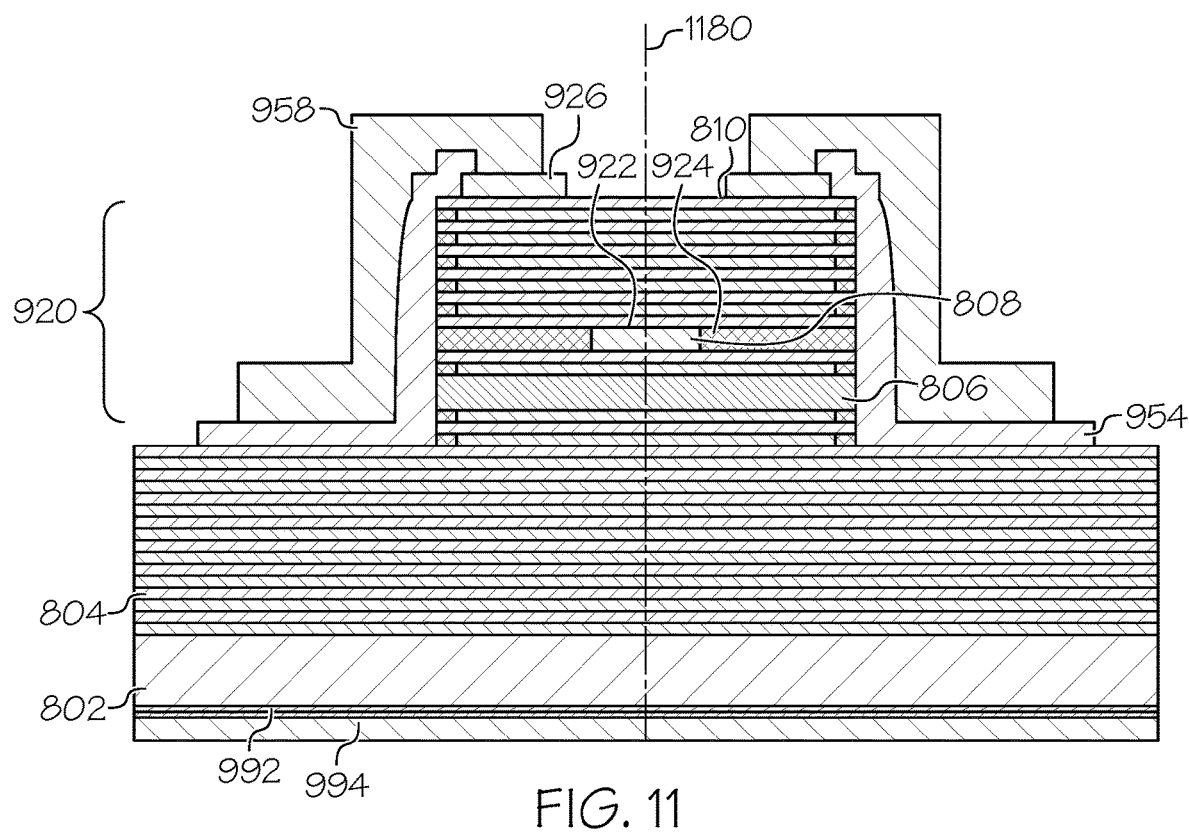
FIG. 11 is a cross-sectional view taken along line X-X' illustrating a later stage in forming the vertical cavity surface emitting laser semiconductor device of FIG. 8 with a bi-stable resistive system integrated on a backside contact, according to one embodiment of the present invention.

Embodiment 3: Vertical Wave Guide
Semiconductor Device with BRS with Bottom Contact FIG. 11 is a side view illustrating a vertical cavity surface emitting laser semiconductor device with a bi-stable resistive system integrated on a backside contact, according to another embodiment of the present invention. The process flow for FIG. 8 through FIG. 9A is modified so that the BRS layer 952 and well 960 are no longer formed.

In this embodiment, the BRS layer 992 is deposited horizontally on the backside of the substrate 802 followed by the horizontal disposition of a bottom metal contact layer 994, such as Ti/Au as shown. In this example, the BRS is a threshold switching selector (TSS), such as ex: Ag/HfO$_2$, Cu/HfO$_2$, Ag/TiO$_2$. It is important to note that although the integration of a multi-layer TSS is described, an insulator-to-metal transition (IMT) material or other bi-stable resistive system could be implemented instead. A quantization axis 1180 is shown perpendicular to aperture 922.

Figure 12:
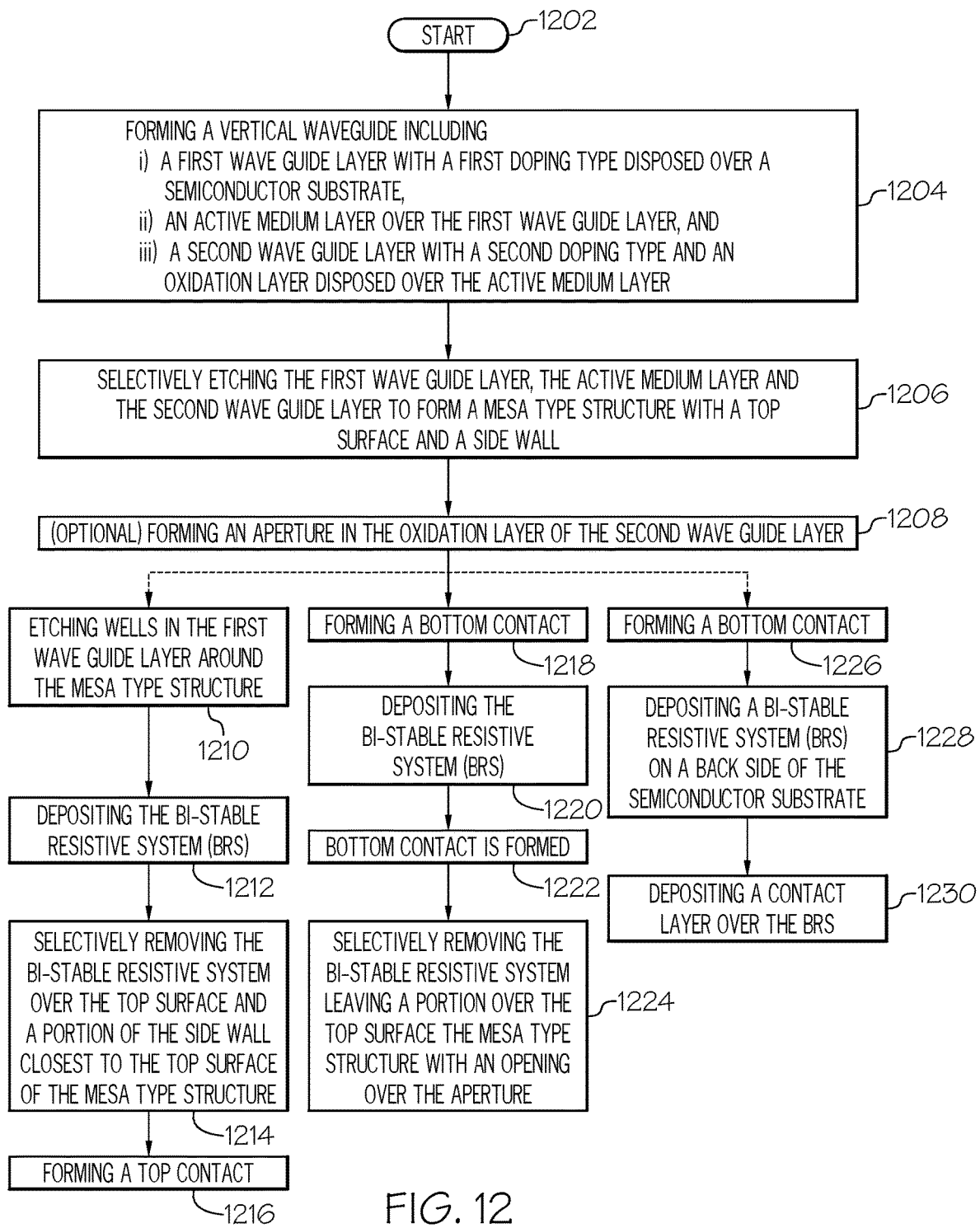
FIG. 12 is a flow diagram illustrating one example of a process for forming a vertical cavity surface emitting laser semiconductor device with an integrated bi-stable resistive system according to one embodiment of the present invention.

Flow Diagram of Vertical Wave Guide Semiconductor Device with BRS Integrated on Either a Buried Bottom Contact or a Top Contact or Backside Contact FIG. 12 is a flow diagram illustrating one example of a process for forming a vertical cavity surface emitting laser semiconductor device with a bi-stable resistive system according to one embodiment of the present invention. It should be noted that each of the steps shown has been discussed in greater detail with respect to FIGS. 8 to 11 above. The process begins in step 1202 and immediately proceeds to step 1204. In step 1204, a vertical wave guide, such as vertical-cavity surface-emitting laser (VCSEL), is formed. The vertical wave guide includes a first wave guide layer 804, with a first doping type disposed over a semiconductor substrate 802, an active medium layer 806 disposed over the first wave guide layer 804, and a second wave guide layer 810 with a second doping type and an oxidation layer 808 disposed over the active medium layer 806. In one example the active medium layer 806 includes multiple quantum wells. The process continues to step 1206.

In step 1206, the first wave guide layer, the active medium layer 806 and the second wave guide layer 810 are selectively etched to form a mesa type structure 920 with a top surface 812 and a side wall as shown in FIGS. 9B, 10, and 11. The process continues to step 1208.

In step 1208 is an optional step in which an aperture 922 is formed in oxidation layer 806 of the second wave guide layer 810 using a wet oxidation process. The process continues down one of the three paths denoted by the dashed line to form either i) buried bottom contact (steps 1210 thru 1216) or ii) top contact (steps 1218 thru 1224) or iii) backside contact (steps 1226 thru 1230).

In the case of the buried bottom contact, the process continues to step 1210. In step 1210, wells 960 are etched in the first wave guide layer 804 around the mesa structure 920. The process continues to step 1212. In step 1212 the bi-stable resistive system 952 is deposited. The process continues to step 1214. In step 1214 the BRS is selectively removed from over the top surface 812 of the second wave guide 810, and a portion of the side wall closest to the top surface 852 of the mesa type structure 920 is removed. The top contact layer 958 is formed in step 1216. The processes for forming the bottom contact layer 954, dielectric layer 950, upper contact layer 926, and the top contact layer 958 are described above.

In the case of the top contact, the process continues to step 1218. First, the bottom contact layer 954 is formed in step 1218. Next, in step 1220, the bi-stable resistive system is deposited. The process continues to step 1222. In step 1222, the top contact 958, is formed. The process continues to step 1224. In step 1224, the bi-stable resistive system 982 is removed, leaving a portion over the top surface the mesa type structure 920 with an opening over the optional aperture 922. Processes for forming, upper contact layer 926, and the top contact layer 958 are described above.

In the case of the backside contact, the process continues to step 1226. The bottom contact layer 954 is formed in step 1226. Next, in step 1228, the bi-stable resistive system 992 is deposited over the bottom surface of the substrate 802. The process continues to step 1230. In step 1230, a metal contact layer 994 is formed over the BRS.

Figure 13A:
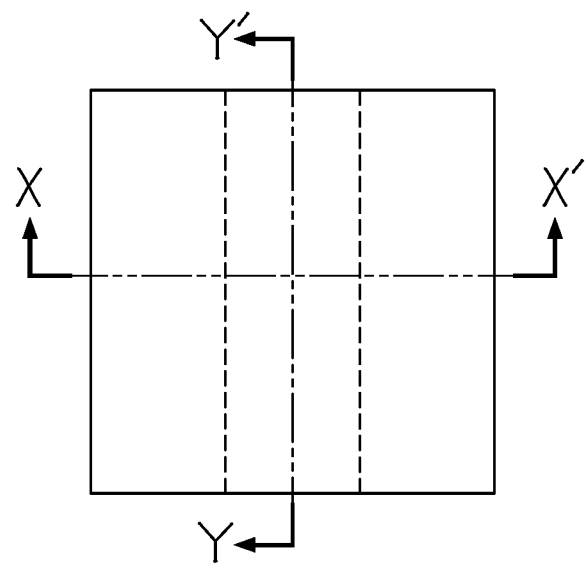
FIG. 13A is a top perspective view and FIG. 13B is a corresponding cross-sectional view taken along line X-X' illustrating an initial stage in the formation of an edge emitting semiconductor laser or diode device with an integrated bi-stable resistive system, according to one embodiment of the present invention.

Embodiment 4: Fabrication of Edge Emitting Laser-Diode Semiconductor Device with a BRS Integrated on a Top Contact FIGS. 13A and 13B are schematic cross-sectional views illustrating an initial stage in the formation of an edge emitting semiconductor laser or diode device with an integrated bi-stable resistive system, according to one embodiment of the present invention.

Figure 13B:
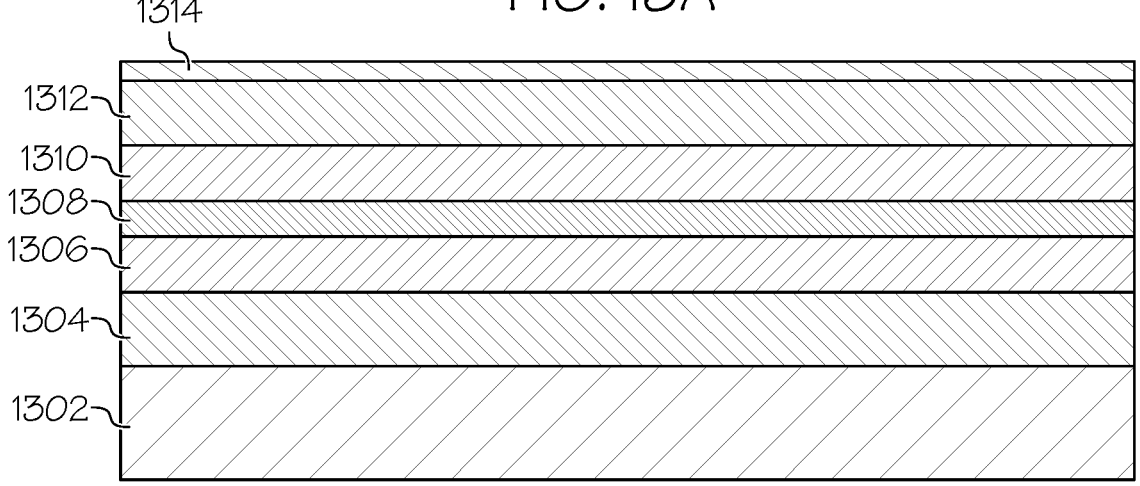

Turning to FIG. 13B, the laser diode is constructed on a substrate 1302 of n-type GaAs carrying thereon a layer 1304 of n-type, such as GaAsP having a composition represented as GaAsyP1-y, wherein the layer 1302 is formed by a molecular beam epitaxy (MBE) and/or a metal organic chemical vapor deposition (MOCVD) process. The growth process of the layer 1304 is well established a smooth surface is realized by optimizing the composition gradient.

Next, a n-type cladding layer 1304, such as n-type AlGaInAsP, a first wave guide layer 1306, an undoped active or active medium with multiple quantum wells layer 1308, such as InGaAsP, a second wave guide layer 1310, a p-type cladding layer 1312, such as p-type AlGaInAsP, and a cap layer 1314 of p-type GaAs formed by an epitaxial process.

Figure 14A:
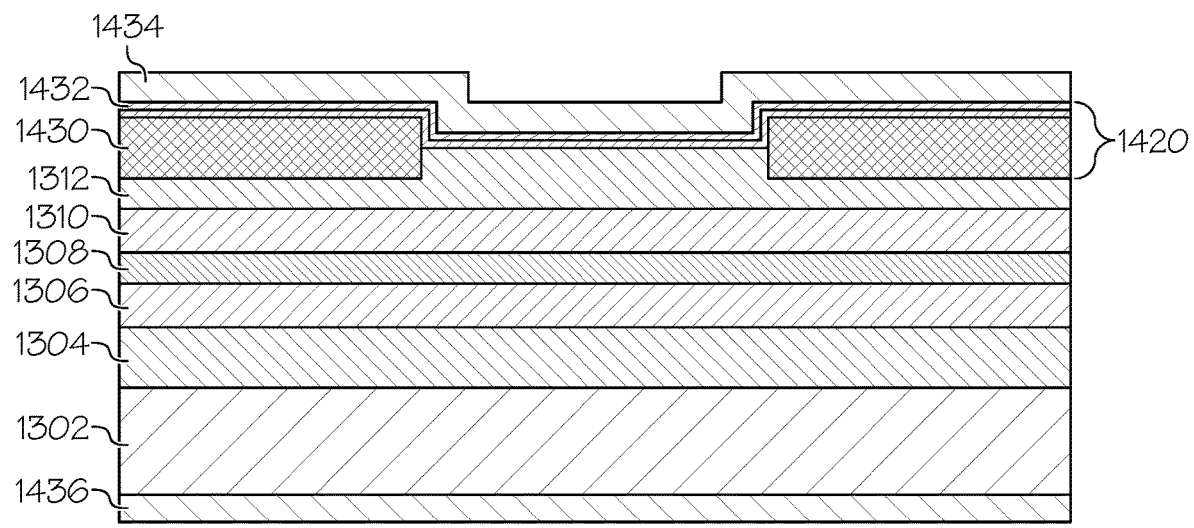
FIGS. 14A and 14B are schematic cross-sectional views taken along X-X' line and Y-Y' line, respectively illustrating a later stage in forming the edge emitting semiconductor laser or diode device of FIG. 13B with a bi-stable resistive system integrated on a top contact, according to one embodiment of the present invention.
Figure 14B:
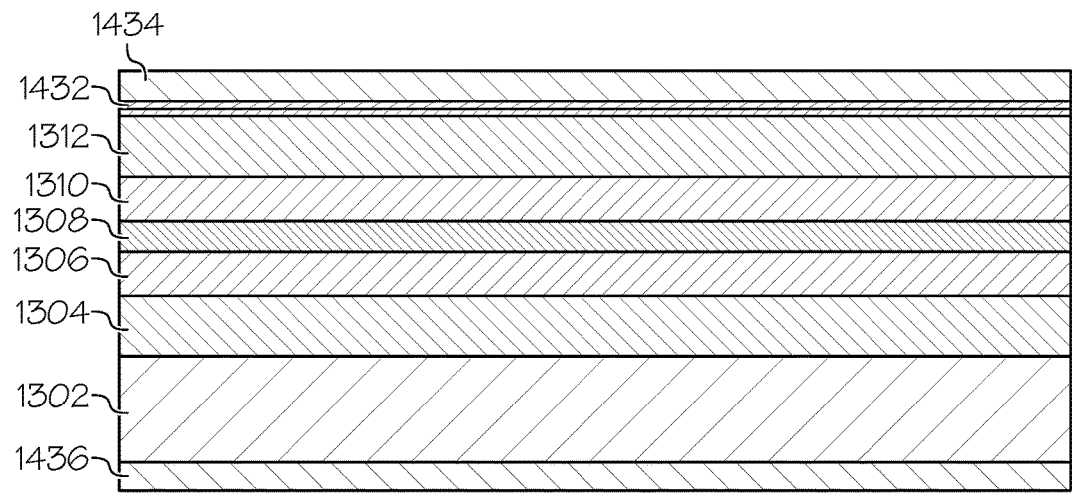

FIGS. 14A and 14B are schematic cross-sectional views illustrating a later stage in forming the edge emitting semiconductor laser or diode device with a bi-stable resistive system integrated on a top contact 1420, according to one embodiment of the present invention.

The p-type cladding layer 1312 and the cap layer 1314 are patterned using lithography techniques and etched to form a mesa type structure 1420 as shown. Next dielectric isolation layer is formed to define the top contact region using sequential Oxide deposition, planarization, lithography patterning and etch techniques.

An oxide layer 1430 is formed by a blanket oxide deposition on top of the p-type cladding layer 1312 including the top and sides of the mesa-type structure 1420. Next, oxide planarization is used. A combination of organic planarization layers (OPL), not shown, followed by lithography patterning and oxide etch, are performed. Next, the OPL is removed using an ashing process. The removal of cap layer 1314 and selective etch of top P-type cladding layer 1312.

Next, a bi-stable resistive system (BRS) layer 1432 is formed over the oxide layer 1430 and the top of the mesa-type structure 1420 as shown. In this example, the BRS 1432 is a threshold switching selector (TSS), such as ex: $Ag/HfO_2$, $Cu/HfO_2$, $Ag/TiO_2$. It is important to note that although the integration of a multi-layer TSS is described, an insulator-to-metal transition (IMT) material or other bi-stable resistive system could be implemented instead.

Finally, the top contact layer 1434 is formed over the BRS layer 1432. Next, a backside contact layer 1436, such as Ti/Au is deposited on the bottom horizontal surface of the substrate 1302 as shown.

Figure 15:
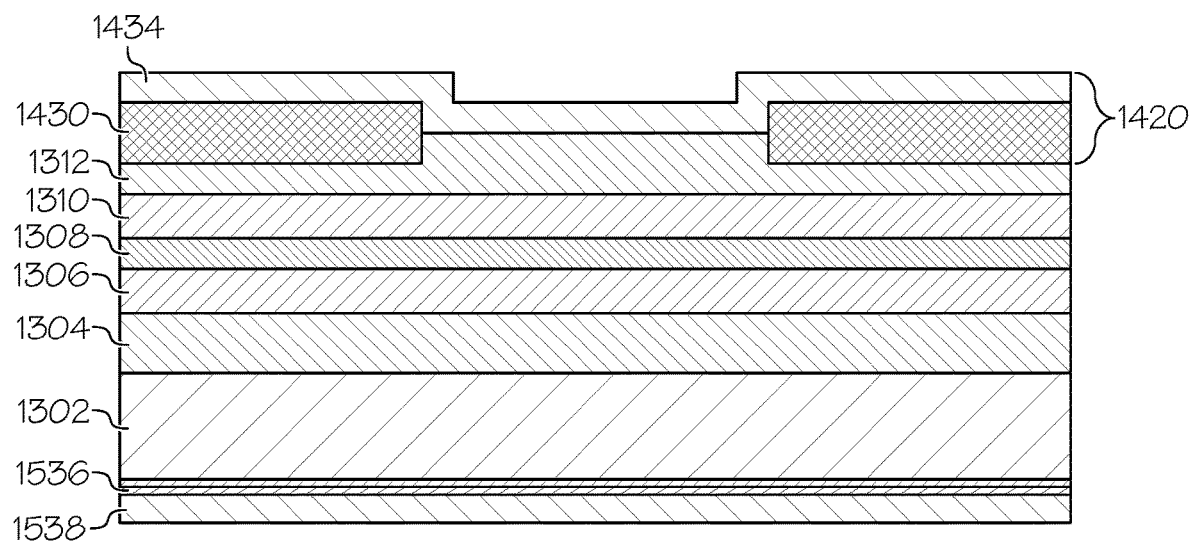
FIG. 15 is a schematic cross-sectional view illustrating a later stage in forming the edge emitting semiconductor laser or diode device of FIG. 13B with a bi-stable resistive system integrated on a backside contact, according to one embodiment of the present invention.

Embodiment 5: Fabrication of Edge Emitting Laser-Diode Semiconductor Device with a BRS Integrated on a Backside Contact FIG. 15 is a schematic cross-sectional view illustrating a later stage in forming the edge emitting semiconductor laser or diode device with a bi-stable resistive system integrated on a backside contact, according to one embodiment of the present invention.

The process flow for FIGS. 13A-13B through FIGS. 14A-14B is modified so that the BRS layer is no longer integrated over the top contact region 1420 and top oxide layer 1430.

In this embodiment prior to forming a bottom contact layer 1436, a BRS layer 1536 is deposited on the back side of the doped-substrate 1302 followed by the disposition of a backside metal contact layer 1538, such as Ti/Au as shown.

Figure 16:
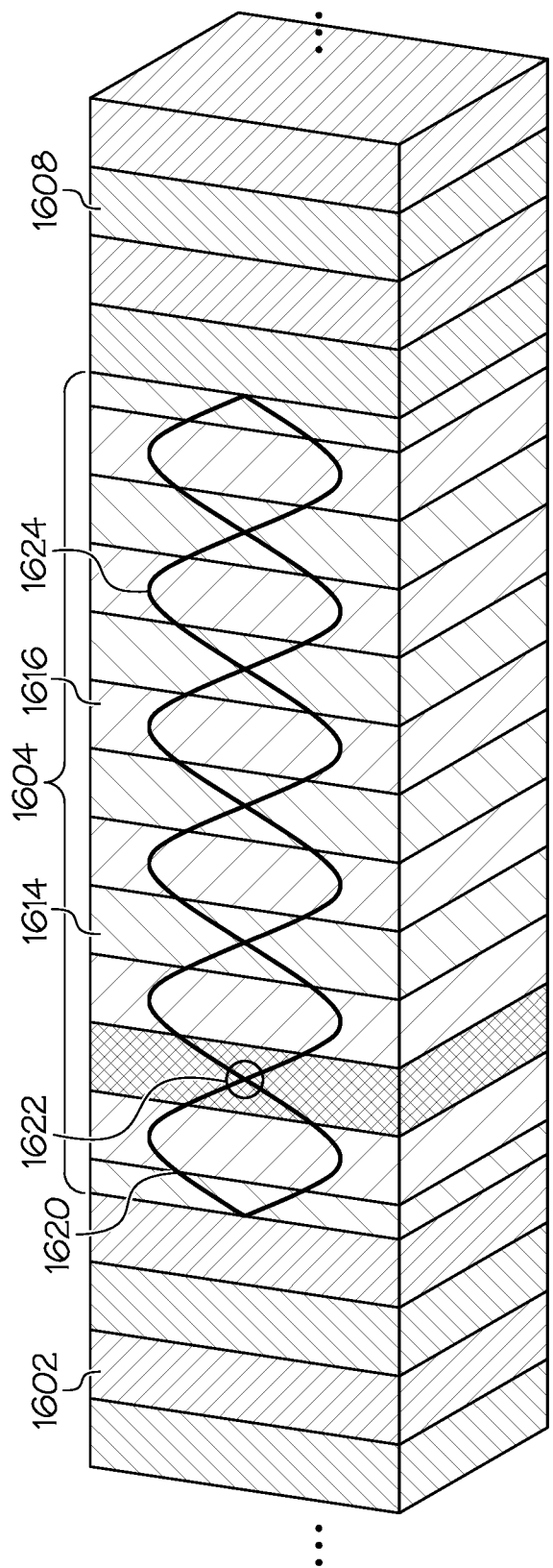
FIG. 16 is a schematic side view illustrating a semiconductor laser device with a bi-stable resistive system integrated within the active medium of the laser, according to one embodiment of the present invention.

Embodiment 6: BRS Integration in the Laser Active Medium within the Optical-Cavity FIG. 16 is a schematic side view illustrating a semiconductor laser device with a bi-stable resistive system integrated within the active medium of the laser, according to one embodiment of the present invention. Illustrated is a first Distributed Bragg Reflector (DBR) or wave guide 1602, an active layer or active medium 1604. The active medium in one example, includes multiple quantum wells formed by a series of barriers 1614 and quantum wells 1616 as known in the art. Also shown is a second DBR 1608. A bi-stable resistive system (BRS) layer 1614 is formed. A stationary electromagnetic field 1620 is depicted. The BRS layer 1614 is deposited in-situ during the epitaxy process in a node 1622 of the stationary electromagnetic field 1620 oscillating inside the optical cavity to minimize potential light absorption. The BRS layer may also act as a barrier. The maximum amplitude 1624 of the stationary electromagnetic field 1620 is selected to maximize interactions with the quantum wells. Note this design works for both vertical cavity and side emitting semiconductor laser devices.

Figure 17:
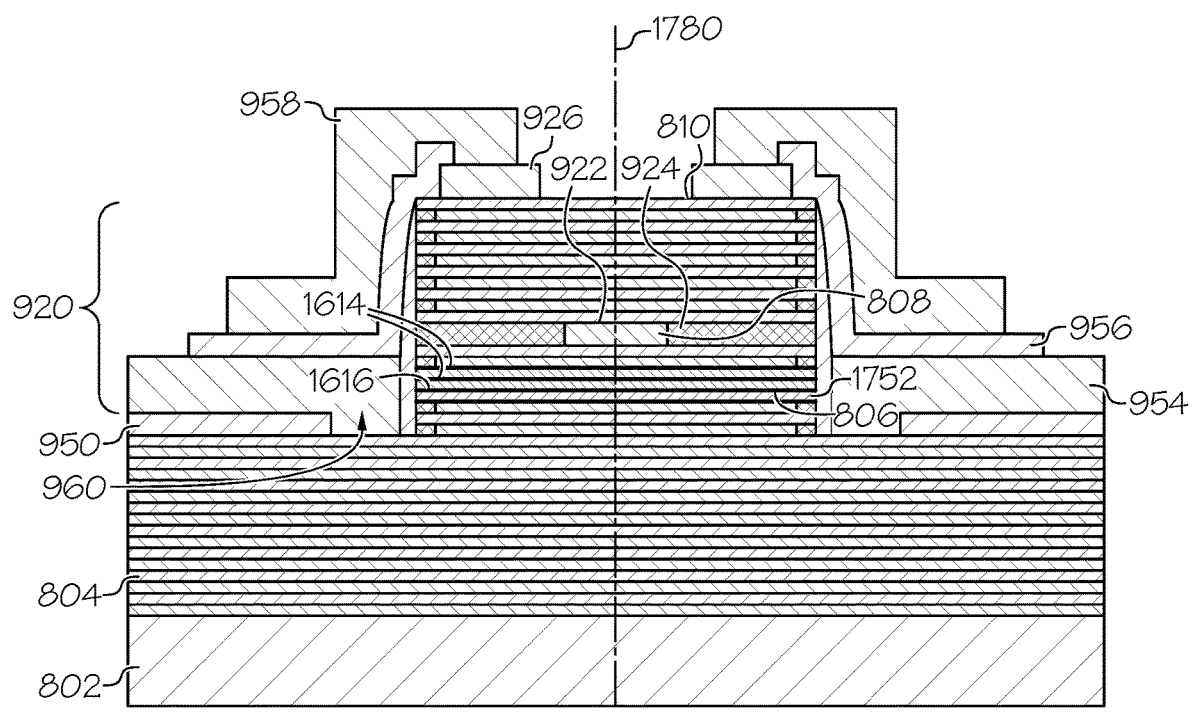
FIG. 17 is a schematic cross-sectional view taken along line X-X' illustrating the formation of a vertical cavity surface emitting laser semiconductor device with a bi-stable resistive system integrated within the active medium of the device, according to one embodiment of the present invention.

FIG. 17 is a schematic cross-sectional view illustrating the formation of a vertical cavity surface emitting laser semiconductor device with a bi-stable resistive system integrated within the active medium of the device, according to one embodiment of the present invention. The process flow for FIG. 8 through FIG. 9A is modified so that a BRS layer 1752 is deposited as shown in FIG. 17 within the optical cavity. A quantization axis 980 is shown parallel to an optical cavity defined by mesa-type structure 920.

Figure 18:
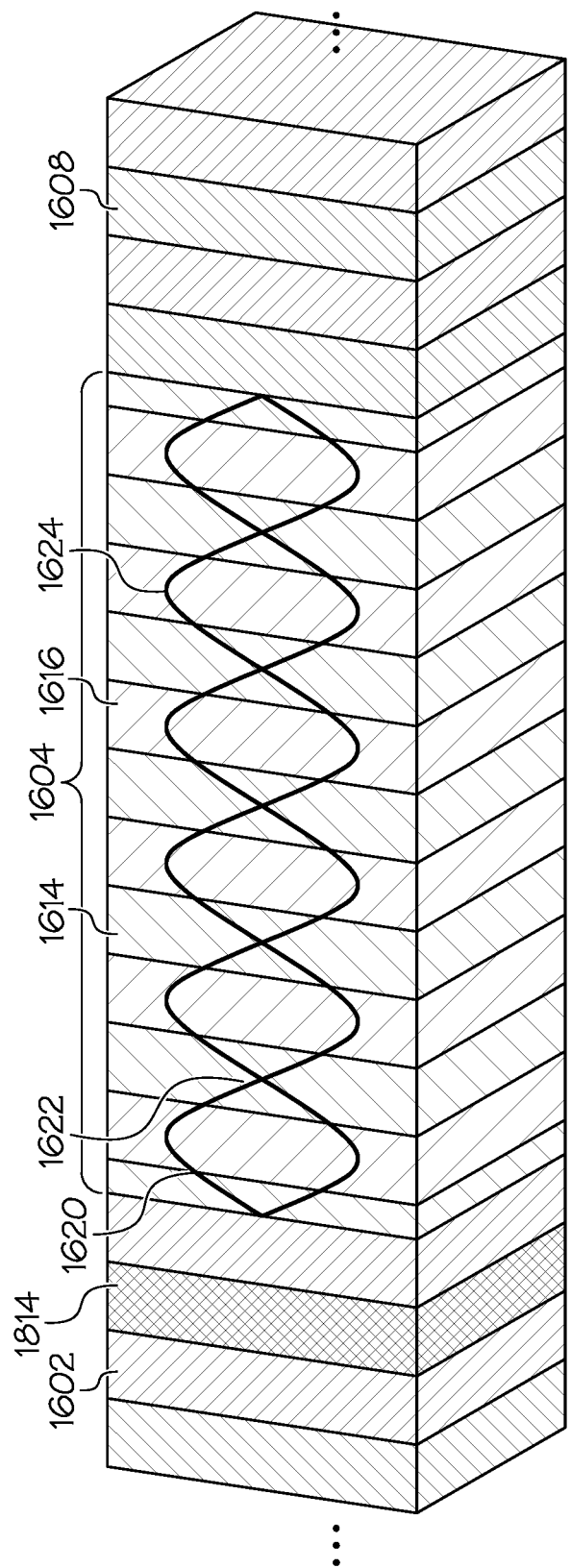
FIG. 18 is a schematic side view illustrating a semiconductor laser device with a bi-stable resistive system integrated within the wave guide of the laser optical cavity, according to one embodiment of the present invention.

Embodiment 7: BRS Integration in One of the Wave Guide Constituting the Laser Optical-Cavity FIG. 18 is a schematic side view illustrating a semiconductor laser device with a bi-stable resistive system integrated within the wave guide of the laser optical cavity, according to one embodiment of the present invention.

Illustrated is a first Distributed Bragg Reflector (DBR) or wave guide 1602, an active layer or active medium 1604. The active medium in one example includes multiple quantum wells formed by a series of barriers 1614 and quantum wells 1616 as known in the art. Also shown is a second DBR 1608. A bi-stable resistive system (BRS) layer 1814 is created within the wave guide 1602 as shown. A stationary electromagnetic field 1620 is depicted. The BRS layer 1614 is deposited in-situ during the epitaxy process at a node 1624 of the stationary electromagnetic field 1620 oscillating inside the optical cavity to minimize potential light absorption. The maximum amplitude 1624 of the stationary electromagnetic field 1620 is selected to maximize interactions with the quantum wells. Note this design works for both vertical cavity and side emitting semiconductor laser devices. The BRS may be integrated in any of the either one of the wave guides 1602 or 1608.

Figure 19:
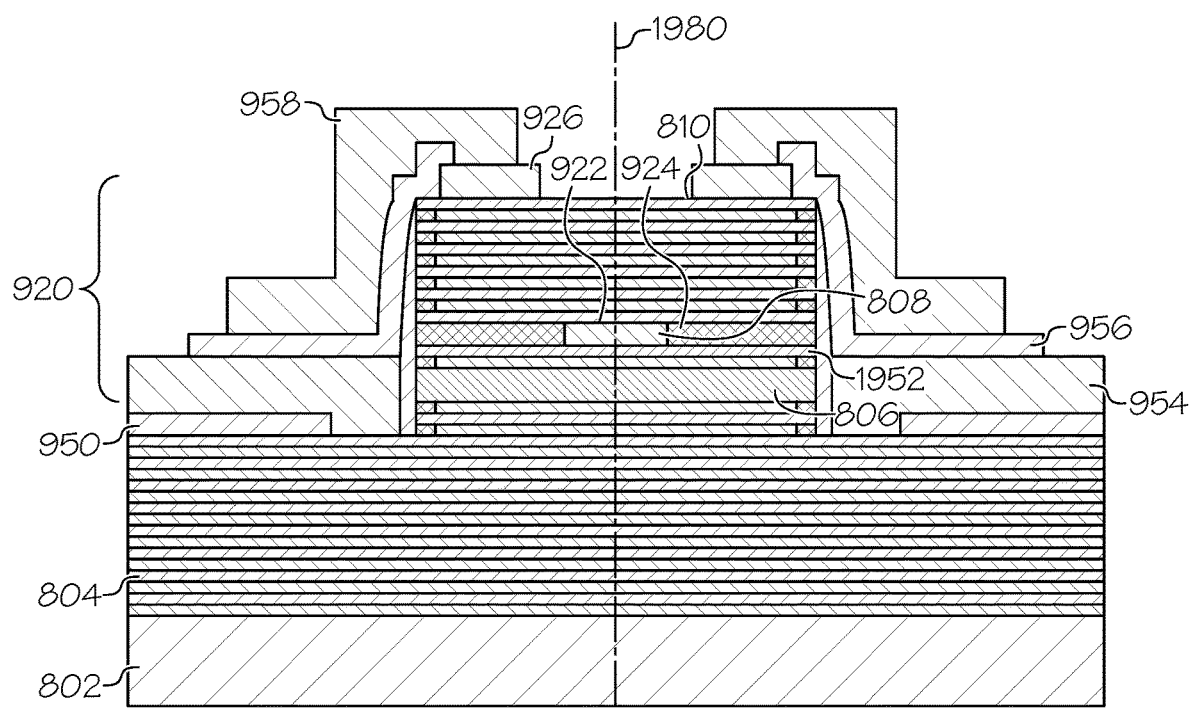
FIG. 19 is a schematic cross-sectional view taken along line X-X' illustrating the formation of a vertical cavity surface emitting laser semiconductor device with a bi-stable resistive system integrated within the wave guide of the laser optical cavity, according to one embodiment of the present invention.

FIG. 19 is schematic cross-sectional view illustrating the formation of a vertical cavity surface emitting laser semiconductor device with a bi-stable resistive system integrated within the wave guide of the laser optical cavity, according to one embodiment of the present invention. The process flow for FIG. 8 through FIG. 9A is modified. Instead of a BRS layer 1814 formed as shown in FIG. 18, in this example a BRS layer 1952 is formed within the optical cavity. One example of epitaxy-compatible threshold-switching selector is taught by K. Fu et al., "Threshold Switching and Memory Behaviors of Epitaxially Regrown GaN-on-GaN Vertical p-n Diodes With High Temperature Stability," in IEEE Electron Device Letters, vol. 40, no. 3, pp. 375-378, March 2019. A quantization axis 1980 is shown parallel to an optical cavity defined by mesa-type structure 920.

Figure 20:
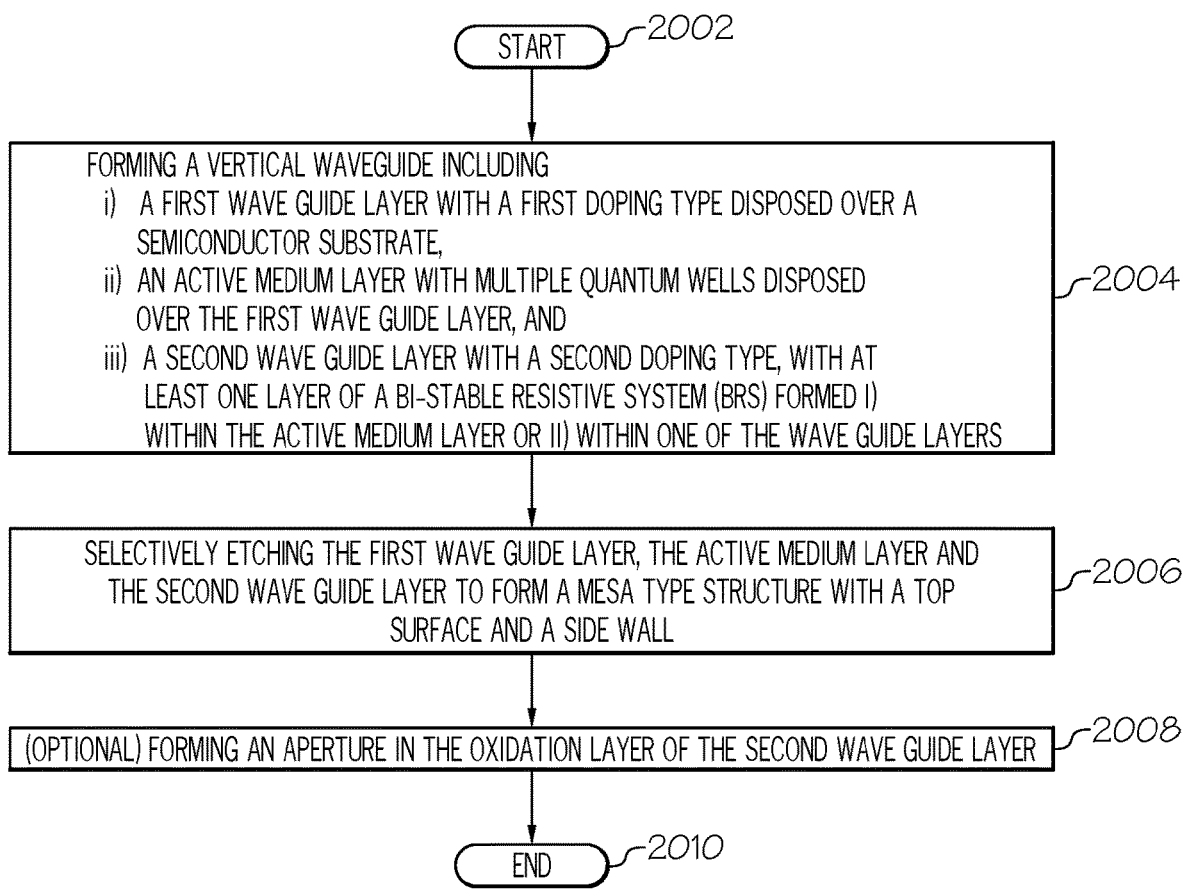
FIG. 20 is a flow diagram illustrating one example of a process for forming a laser semiconductor device with a bi-stable resistive system inside the active medium or wave guide of the laser, according to one embodiment of the present invention.

Flow Diagram of Integration Inside Laser Optical-Cavity in Active Component or Wave Guide FIG. 20 is a flow diagram illustrating one example of a process for forming a laser semiconductor device with a bi-stable resistive system inside the active medium or wave guide of the laser according to one embodiment of the present invention. It should be noted that each of the steps shown in FIG. 20 has been discussed in greater detail with respect to FIGS. 13A-B to 19 above. The process begins in step 2002 and immediately proceeds to step 2004. In step 2004, a vertical wave guide, such as vertical-cavity surface-emitting laser (VCSEL), is formed. The vertical wave guide includes a first wave guide layer 804, with a first doping type disposed over a semiconductor substrate 802, an active medium layer 806 disposed over the first wave guide layer 804, and a second wave guide layer 810 with a second doping type and an oxidation layer 808 disposed over the active medium layer 806. In one example, a bi-stable resistive system layer 1614 is formed within the active medium. In another example, a bi-stable resistive system layer 1814 is formed within the second wave guide layer 810. The active medium layer 806 may include multiple quantum wells. The process continues to step 2006.

In step 2006, the first wave guide layer 804, the active medium layer 806 and the second wave guide layer 810 to form a mesa type structure 920 with a top surface and a side wall as shown above. The process continues to step 2008.

In step 2008, is an optional step in which an aperture 922 is formed in the oxidation layer of the second wave guide layer 810. The process completes in step 2010.

Non-Limiting Examples

Although specific embodiments of the invention have been discussed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A vertical wave guide laser semiconductor device comprising:
    a semiconductor substrate, and a layer structure formed thereon with a quantization axis of an active medium layer parallel with a vertical axis of an optical cavity, the layer structure including
        a first wave guide layer with a first doping type disposed over a semiconductor substrate,
        the active medium layer disposed over the first wave guide layer, and
        a second wave guide layer with a second doping type;
    a mesa type structure with a top surface and a side wall formed from the first wave guide layer, the active medium layer and the second wave guide layer;
    a bi-stable resistive system (BRS) formed on the top surface of the mesa type structure;
    a first contact layer formed adjacent to the mesa structure and over the first wave guide layer;
    an aperture formed in the second wave guide layer; and
    a second contact layer formed over the second wave guide layer and having an opening over the aperture, the second contact layer is electrically isolated from the first contact layer.

2. The vertical wave guide laser semiconductor device of claim 1, wherein the layer structure is a vertical-cavity surface-emitting laser (VSCEL).

3. The vertical wave guide laser semiconductor device of claim 1, wherein the bi-stable resistive system is formed using insulator-to-metal transition (IMT) materials.

4. The vertical wave guide laser semiconductor device of claim 1, wherein the bi-stable resistive system is formed using threshold-switching selectors.

5. The vertical wave guide laser semiconductor device of claim 1, wherein the bi-stable resistive system operating as a reversible switch is electrically connected in series across two independent chips.

6. The vertical wave guide laser semiconductor device of claim 1, wherein the bi-stable resistive system operating as a reversible switch is electrically connected in series on a single wafer.

* * * * *